United States Patent
Vewinger et al.

(10) Patent No.: US 8,811,449 B2
(45) Date of Patent: Aug. 19, 2014

(54) LIGHT SOURCE AND METHOD FOR PRODUCING LIGHT

(75) Inventors: Frank Vewinger, Bonn (DE); Martin Weitz, Bonn (DE); Jan Klaers, Bonn (DE)

(73) Assignee: Rheinische Friedrich-Willhelms Universitaet Bonn, Bonn (DE)

(*) Notice: Subject to any disclaimer, the term of this patent is extended or adjusted under 35 U.S.C. 154(b) by 77 days.

(21) Appl. No.: 13/501,523

(22) PCT Filed: Sep. 21, 2010

(86) PCT No.: PCT/EP2010/005758
§ 371 (c)(1),
(2), (4) Date: May 2, 2012

(87) PCT Pub. No.: WO2011/047760
PCT Pub. Date: Apr. 28, 2011

(65) Prior Publication Data
US 2013/0064264 A1    Mar. 14, 2013

(30) Foreign Application Priority Data
Oct. 19, 2009  (DE) .......................... 10 2009 049 962

(51) Int. Cl.
*H01S 3/20* (2006.01)
*H01S 3/091* (2006.01)
*H01S 3/08* (2006.01)

(52) U.S. Cl.
USPC ................................. 372/70; 372/53; 372/99

(58) Field of Classification Search
USPC ............................... 372/39, 53, 70, 92, 99, 98
See application file for complete search history.

(56) References Cited

U.S. PATENT DOCUMENTS

| 5,610,932 A * | 3/1997 | Kessler et al. ................... 372/39 |
| 2004/0190579 A1 * | 9/2004 | Hayashibe et al. ............. 372/92 |

* cited by examiner

*Primary Examiner* — Armando Rodriguez
(74) *Attorney, Agent, or Firm* — Andrew Wilford

(57) ABSTRACT

The invention relates to a light source, comprising an optical resonator (1) and an optical medium (2) arranged therein that can be excited so as to emit light, wherein the optical medium (2) comprises at least one two-level system, in particular a two-level system that is not population-inverted, having an at least metastable lower state, and the optical length of the resonator (1) comprising at least one curved mirror (1) is selected such that the free spectral bandwidth of the resonator is equal to or greater than the absorption bandwidth and/or fluorescence bandwidth of the optical medium (2) and only a single longitudinal mode and a plurality of transversal modes of the resonator (1) are arranged within the fluorescence bandwidth. The invention further relates to a method for producing light by means of an optical resonator (1) and an optical medium (2) arranged therein that can be excited so as to emit light, wherein at least one two-level system, in particular a two-level system that is not population-inverted, having an at least metastable lower state is selected as the optical medium (2), and the optical length of the resonator (1) comprising at least one curved mirror (1) is set in such a way that the free spectral bandwidth of the resonator is greater than the absorption bandwidth and/or fluorescence bandwidth of the optical medium (2) and only a single longitudinal mode (3) and a plurality of transversal modes (4) of the resonator (1) within the fluorescence bandwidth of the optical medium (2) are produced by means of excitation.

11 Claims, 3 Drawing Sheets

LIGHT SOURCE AND METHOD FOR PRODUCING LIGHT

CROSS REFERENCE TO RELATED APPLICATIONS

This application is the US-national stage of PCT application PCT/EP2010/005758 filed 21 Sep. 2010, published 28 Apr. 2011 as WO2011/047760, and claiming the priority of German patent application 102009049962.8 itself filed 19 Oct. 2009.

FIELD OF THE INVENTION

The invention concerns a light source comprising an optical resonator and an optical medium excitable to light emission held in it. The invention also concerns a method of generating light with an optical resonator and an optical medium excitable to light emission held in it.

BACKGROUND OF THE INVENTION

Light sources of this basic type are ordinarily operated in the prior art as lasers in which an optical medium excitable to stimulated light emission is population inverted by external excitation, for example, by optical pumping, in order to generate stimulated emission on the population-inverted transition and therefore laser activity by resonant feedback in the resonator.

Optical media comprising a multilevel system, especially a three- or four-level system, are ordinarily used for such laser applications, in which laser activity occurs between two levels, the lower level of which is quickly depopulated in order to achieve the population inversion by excitation of the upper level.

A level in the multilevel system of the optical medium is often excited by electrical, chemical or optical excitation, in which case this excited state then breaks down internally to the upper laser level and a radiation transition to the lower laser level occurs that is then quickly depopulated to the base state.

Energy conversion therefore also occurs in such a laser process, especially wavelength conversion of the introduced shorter wave pump wavelength to the emitted longer wave laser wavelength occurs during optical pumping. The efficiencies of such laser light sources with optical media in optical resonators are sometimes very low and can therefore only be used with restrictions for energy or wavelength conversion but, on the other hand, have the advantage of high coherence and high monochromaticity.

The need for inversion of the medium also restricts the spectral working range, since appropriate three- or four-level laser media are not available for all optical wavelength ranges. For example, the increase in spontaneous emission with optical frequency hampers inversion of atomic transitions of very high transition frequency so that laser sources are only available to a very limited degree in the UV or x-ray range.

In lighting applications such high requirements are often not imposed on monochromaticity and coherence so that light sources other than the laser systems with restricted efficiency and wavelength range, in principle, could also be used, but unfortunately are not available in the prior art.

OBJECT OF THE INVENTION

The object of the invention is therefore to provide a light source of the type described above, as well as a method of generating light with an optical resonator and an optical medium excitable to light emission held in it, with which, in the first place, high energy and especially wavelength conversion are achieved and, in the second place, there is also the possibility of collecting light with high efficiency and/or at least generating largely coherent light without having to resort to a laser process with the usual population inversion between the participating levels and the accompanying low efficiency and limited wavelength range.

SUMMARY OF THE INVENTION

Thus according to the invention the optical medium includes at least one two-level system, especially at least one nonpopulation-inverted two-level system with at least a metastable lower or base state as lower state with high lifetime, in which the optical length of the resonator containing at least one curved mirror is chosen so that its free spectral bandwidth is as large as or larger than the absorption and/or fluorescence bandwidth of the optical medium and only a single longitudinal mode and several transverse modes of the resonator lie within the fluorescence bandwidth.

In contrast to the laser applications known in the prior art, at least one two-level system is chosen here according to the invention as an optical medium, this two-level system being characterized in that the lower of the two participating levels is at least metastable or represents the base state of the chosen medium. Preferably a two-level system of the type according to the invention is therefore understood to be one in which at least one of the two levels is widened, i.e. the two-level system need not be a true two-level system but can also be a "blurred" multilevel system, as is the case, for example, in dyes or solids.

Unlike the usual media used for laser activity, the lower level of the two-level system employed according to the invention therefore has a comparatively long lifetime, especially one higher than the upper of the two participating levels. Because of this a population inversion and the accompanying laser activity is avoided and thermodynamic equilibrium, which is preferably prescribed, is favored.

The employed optical medium can naturally be one that has more than just two states, but in which for the light source and method according to the invention only two levels (preferably a broad one) are used for generating light, namely for the purpose of emission of the wavelength defined by the level and also for is especially multiple reabsorption of the generated photons in order to preferably favor the thermodynamic equilibrium just described. Consequently a two-level system or optical medium that is optically dense relative to the emission wavelength is preferred.

Pumping (optical, electrical, chemical, etc.) and therefore excitation of the upper, for example, blurred level of the two levels of the two-level system can also occur via auxiliary levels that preferably do not further participate in emission and reabsorption according to the invention.

An essential key idea of the invention is that in the light source described here only a single longitudinal mode can be generated by combining the resonator with the optical medium based on the outlined length adjustment of the resonator, since the free spectral bandwidth (FSR) is chosen by shortening the resonator length so that a next adjacent longitudinal mode of the resonator lies outside the fluorescence bandwidth of the employed optical medium.

This can preferably be achieved if the optical resonator length L for a desired wavelength corresponds to $\lambda L = n \cdot (\lambda/2)$ and n is chosen less than or equal to 40, preferably n less than or equal to 10, with further preference n less than or equal to 6 and especially n is equal to 1.

It could be determined in such a configuration that the photons within the resonator can be described as a so-called two-dimensional photon gas in which the radiation field in the generator is merely dictated by the one longitudinal base mode and several transverse modes and below a critical photon number in the resonator follows a spectral Boltzmann distribution with the longitudinal resonator mode as upper wavelength limit and above a critical photon number in the resonator corresponds to a Bose-Einstein distribution with a strongly increased longitudinal mode in intensity relative to the transverse mode, again as upper wavelength limit.

The light source according to the invention can then preferably be operated in thermodynamic equilibrium, which is supported by the use of at least one two-level system that is optically dense at the emission wavelength and therefore causes reabsorption of the emitted photons. Thermodynamic equilibrium here is achieved particularly well, if a reabsorption probability of the emitted photons is greater than 50, preferably greater than 75%.

In a preferred application incoherent light can be introduced to the optical medium within its absorption bandwidth and at least partially coherent spectrally Bose-Einstein-distributed light emitted by adjusting the number of photons in the resonator above a critical photon number, as mentioned above.

It is thus found that above the critical photon number the light distributed directly by the longitudinal resonator mode and strongly increased in intensity is in thermodynamic equilibrium because of Bose-Einstein condensation of the photon gas under the outlined operating conditions.

In the three-dimensional emission profile of the resonator according to the invention, i.e. the light that leaves the resonator through a mirror of the resonator, this coherent light fraction of the longitudinal base mode can have the lowest divergence and be arranged centered so that it can be separated from the three-dimensional profile, for example, from the surrounding beam fractions by a diaphragm arrangement.

The other spectral fractions represent transverse modes, that have higher divergence and enclose the coherent light fraction essentially in annular fashion and thus can be retained by a diaphragm.

The described light source according to the invention can therefore be used in a preferred application in order to convert incoherent light to coherent light, especially if the optical medium of the light source according to the invention is optically pumped with light that lies within the absorption bandwidth of the employed optical medium.

Relative to a laser arrangement the light source and the method according to the invention for generating light have the special advantage that the pump light can encounter the optical medium anywhere and anyway (even diffusely) and need not have the largest possible overlap with the resonator mode, as in the laser application.

The pump wavelength can also lie close to the emission wavelength and the medium therefore used without heat development. For example, the pump wavelength can be positioned in a region of the absorption spectrum that has an overlap with the emission spectrum.

In another application the photon number can be set below the critical photon number that corresponds to $Nc=(\pi^2/(3(hc)^2))\cdot(k_b T)^2\cdot D_0\cdot R$, in which T corresponds to the temperature of the medium, $D_0$ the spacing of the mirrors of the resonators and R the radius of a mirror assumed to be spherical in combination with a plane mirror. It must be kept in mind here that resonators with two curved mirrors can also be effectively recalculated to resonators with one curved and one plane mirror.

Below this mentioned critical photon number in the resonator, as previously prescribed, the spectral light distribution is Boltzmann-distributed with a long-wave wavelength limit that corresponds to the single longitudinal mode that is defined by the geometric resonator configuration.

Above and below the critical photon number, in conjunction with the optical medium, a situation is obtained in which energy conversion to longer wavelengths (i.e. in the direction toward the energy minimum) occurs in the photons absorbed in the optical medium by the emission and reabsorption processes repeatedly occurring in the optical medium, especially in thermal equilibrium, namely the minimum that is given by the resonator as effective potential and corresponds to its longitudinal base mode.

Any photon absorbed in the employed medium is therefore converted ultimately to a longer wave photon with a Boltzmann distribution or at higher intensity in a Bose-Einstein distribution, in each case with the resonator base mode as upper wavelength limit.

A light source according to the invention can therefore be used to convert light with a first bandwidth, for example sunlight, to light of a second bandwidth lower than the first that is Boltzmann-distributed or Bose-Einstein-distributed with maximum intensity close to the longitudinal base mode (Boltzmann-distributed) or at the longitudinal base mode (Bose-Einstein-distributed).

Because of this, especially at low intensities below the critical photon number, an application is opened up in conjunction with solar cells that ordinarily have maximum energy conversion in the near-infrared range, especially around 800 nanometers, so that it becomes possible with a light source according to the invention to trap photons in the entire visible spectrum and near-infrared spectrum of sunlight in the optical medium and shift them in the direction toward the near-infrared spectral range, if the longitudinal resonator mode is set at the working wavelength typical for solar cells.

In order to provide an optical medium with correspondingly broad absorption in this or other applications it can be prescribed to work not only with a single two-well system as optical medium, but optionally simultaneously with several two-level systems, for example, in the fashion of a mixture of several different systems, for example, dyes.

In this case it is essential to select the employed two-level systems so that their absorption and emission bands at least partially overlap each other in order to permit in the course of repeatedly occurring emission and reabsorption of the optical medium that photons emitted by one two-level system are absorbed again by another two-level system because of the described overlap.

Thus, all photons trapped within the absorption bandwidth so overlapping can effectively be shifted in wavelength in the direction of the single longitudinal resonator mode and emitted from the resonator.

An application therefore is obtained in which a light source according to the invention can be used in conjunction with solar cells with an appropriately selected optical medium.

The light source according to the invention, in addition to the described spectral collection, also permits three-dimensional collection of light, since with approach to thermodynamic equilibrium, for example, light impinging on the side of the resonator is pulled in the direction of the center of the resonator arrangement.

This permits cost-effective use of or in conjunction with solar cells that are spatially smaller than the entire effective surface over which light collection occurs. Unlike arrangements for light collection according to the prior art, for example, lens or mirror arrangements, no spatial tracking during a change in sun position is required here. The arrangement according to the described invention also works with diffuse light.

In another technical implementation a medium already acting as a solar cell, i.e. converting light to electricity, can be directly used in or adjacent the resonator within the light source. For example, such a medium can be connected on the outside to a mirror of the resonator. This medium can optionally itself form the mirror if it has a correspondingly curved surface that is coated reflective. Such a solar medium can also be connected in the resonator directly to the other optical medium.

The possibility exists in another application of embedding dyes as optical medium in polymers and embedding them as optical media in a mirror configuration according to the invention, i.e. a resonator with the length intervals previously described between the mirrors and achieving a coherent light source by excitation and adjustment of a photon number above the critical number.

Materials, for example, the materials known as OLED materials, can be used in the resonator that can also be excited electrically to light emission, in which case a cost-effective high efficiency electrically operated coherent light source can be achieved by corresponding adjustment of the operating parameters, especially the photon number above the above-described critical number in thermal equilibrium.

Atomic or molecular gases could also be used as medium, for example, noble gases at high pressure appear to be advantageous. Collisions between noble gas atoms are highly elastic and the increasing number of collisions between atoms at increasing pressure permits thermal equilibrium in the gas, which entails the atomic transition that couples to the light. Noble gases offer not only transitions in the visible spectral range but also in the UV or x-ray range. By setting a photon number above the critical photon number it becomes possible to achieve a coherent light source in the shortwave spectral range. The light is source according to the invention could be excited to light emission, for example, with a gas discharge within the medium, adjacent the medium or also around it or by exposure to an external light source. An example of one area of use of such shortwave coherent light sources according to the invention is applications in UV and EUV lithography.

Optical media can generally be prepared as follows with reference to all possible applications:
1. Dyes that are dissolved in liquid solvents. Such dye solutions, for example, can be held between the resonator mirrors by adhesion forces. As an alternative, a cell can be arranged between two resonator mirrors or cell surfaces can be directly mirrored in order to form the resonator mirror.
2. Dyes can be mixed into curable matrix materials, for example, UV adhesives. These mixtures can be arranged between two resonator mirrors or on one of the mirrors and cured there.
3. Dyes can also be applied as a thin layer, for example, by a spin coating method on one or both mirrors. The dyes here can be incorporated in a matrix, for example, a polymer matrix.
4. Atomic or molecular gases can be introduced to the resonator. This can occur in particular under high pressure and/or with a buffer gas under high pressure in order to broaden the atomic/molecular resonance (pressure broadening).

BRIEF DESCRIPTION OF THE DRAWING

The figures described below illustrate the basic principle of the light source according to the invention. Therein.

SPECIFIC DESCRIPTION OF THE INVENTION

Figure 1:
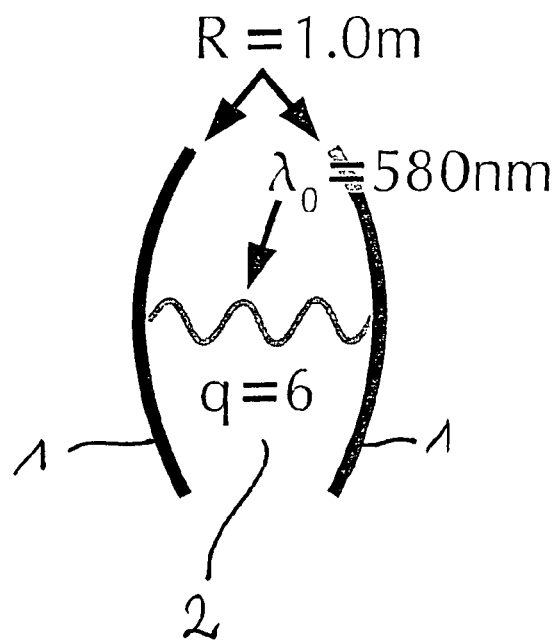
FIG. 1 schematically shows a light source.

FIG. 1 shows in a symbolic view a light source according to the invention comprising two curved hollow mirrors 1, here with a radius of curvature of 1.0 meters. Other radii of curvature and configurations can naturally also be used.

However, it is essential to use at least one curved mirror in order to also permit transverse modes in addition to the longitudinal base mode. The optical medium 2 is between the mirrors 1, not shown separately here, for example, as a drop of a dye, for example, rhodamine 6G. It can generally be prescribed (also in other variants) that a dye drop is held between the mirrors in the intermediate space by adhesion forces. The mirror spacing in this example is set at N=6 half-wavelengths, especially referred to the Rh6G wavelength of 580 nm so that the free spectral range FSR of the resonator is greater than the absorption bandwidth of the dye. Smaller or, depending on the application, even larger numbers N can be chosen, preferably with $1 \leq N \leq 40$.

As an alternative, it can be prescribed in solid media to use a solid of corresponding length ($n \cdot (\lambda/2)$ with n preferably less than 40, 10, 6 or equal to 1) with curved and reflectively coated end surfaces.

Figure 2:
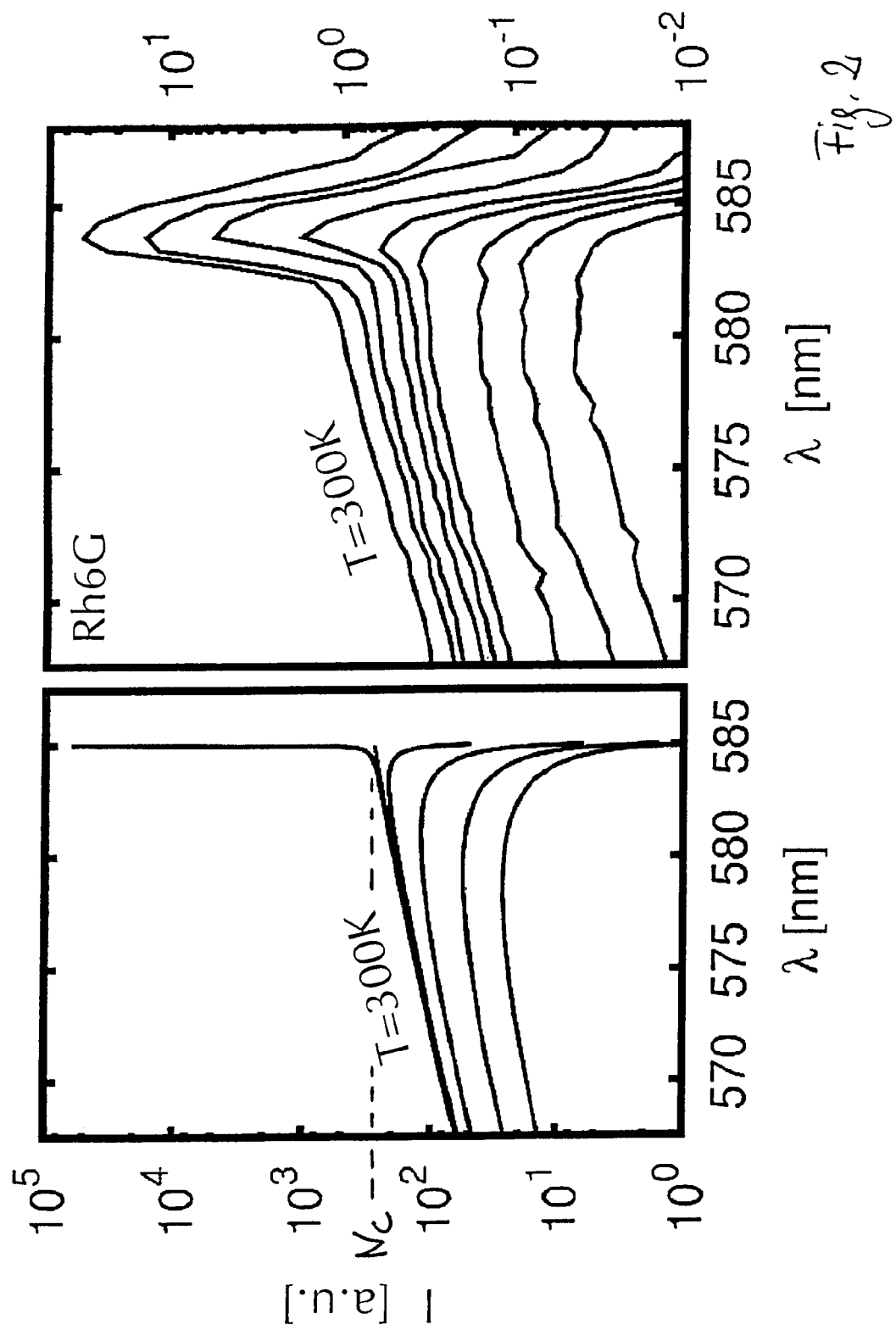
FIG. 2 shows a spectral distribution of an optically excited light source according to the invention at different intensities.

FIG. 2 shows the spectral distribution in theoretical calculation (left) and in an experiment (right) referred to a resonator arrangement with an optical medium from a dye rhodamine 6G in an arrangement according to the invention, i.e. between two resonator mirrors with a spacing in this experiment of, say $6 \cdot (\lambda/2)$ as symbolized in FIG. 2.

FIG. 2 shows here that by optical pumping of this dye within its absorption bandwidth, here, for example, around 532 nanometers, an intensity-dependent emission spectrum is produced. The spectrum at low intensities less than an intensity limit, especially less than a critical photon number Nc, has a typical Boltzmann distribution with an upper wavelength limit that is defined by the resonator base mode.

FIG. 2 also shows that in a case with intensities greater than a limit intensity, especially greater than the critical photon number Nc a significant intensity increase is set in the longitudinal base mode, here at about 583 nanometers, relative to the shorter wave transverse modes. This intensity increase is obtained by Bose-Einstein condensation of the photon gas in thermal equilibrium above the critical photon number so that emission of coherent light in the base mode is produced from the resonator. This emission occurs here preferably through at least one of the mirrors.

In all possible variants a resonator with a very high finesse of say greater than 50,000, preferably greater than 100,000 and with further preference greater than 200,000 can be used here.

Figure 3:
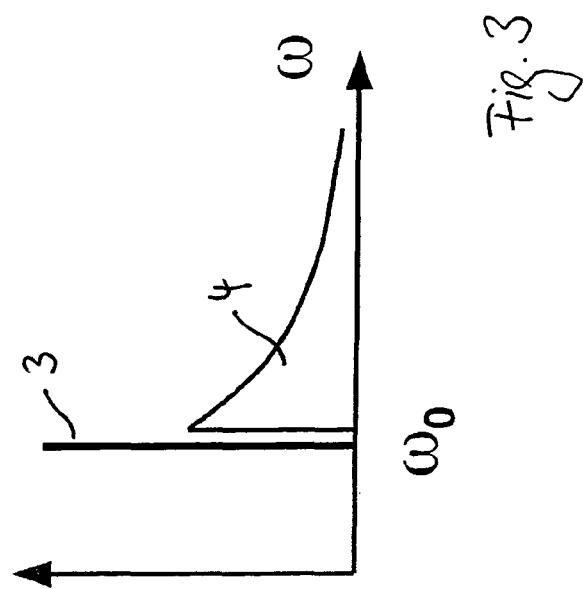
FIG. 3 shows the basic principle of wavelengths and frequency conversion above the critical photon number.
Figure 3:
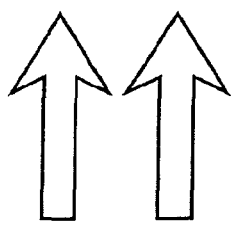
Figure 3:
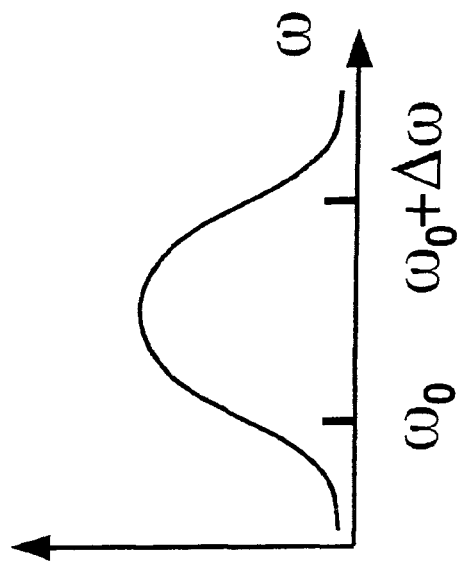

FIG. 3 shows in a symbolized view in the frequency domain that photons in the spectral range of frequency of ω to $\omega_0+\Delta\omega$, i.e. within the absorption, preferably the fluorescence bandwidth of the employed optical medium are converted in a frequency distribution as shown on the right side of FIG. 3 symbolically, if the conditions of thermal equilibrium, surpassing of a critical photon number and therefore occurrence of Bose-Einstein condensation occur.

A longitudinal increased base mode 3 with coherent light emission is then obtained at frequency $\omega_0$, as well as an additional Bose-Einstein-distributed characteristic of the additional transverse modes 4 of the resonator. The energy introduced to the optical medium by the photons through absorption is therefore concentrated essentially on the base mode $\omega_0$ of the resonator that is equivalent to energy or wavelength conversion with the possibility of generating coherent light above the critical photon number, whereas below the critical photon number, as shown in FIG. 2, a Boltzmann-distributed spectrum is essentially attained, which likewise has an energy concentration in the direction for the resonator base mode.

Light sources of the type according to the invention therefore have the advantage of offering the possibility both in incoherent and in the coherent operation of concentrating light introduced to the optical medium with a high spectral bandwidth distribution to a comparatively smaller bandwidth, especially around a wavelength set by the resonator geometry, in which the conversion efficiency theoretically corresponds to 100%, if internal losses of the light source are ignored. Light sources of the type according to the invention can be actively pumped electrically, chemically or optically by additional operated pump energy sources or even operated "passively" by optical pumping by the ambient light present anyway, especially sunlight.

The invention claimed is:

1. A light source comprising:
a curved mirror forming an optical resonator and
an optical medium excitable to light emission held in the resonator and having at least one nonpopulation-inverted two-level system with a metastable lower state, an optical length of the curved mirror being chosen so that its free spectral bandwidth is as large as or larger than the absorption or fluorescence bandwidth of the optical medium and only a single longitudinal mode and several transverse modes of the resonator are in the fluorescence bandwidth, the source being in thermodynamic equilibrium of the radiation field with the medium and having a reabsorption probability of emitted photons greater than 50%.

2. The light source according to claim 1, wherein the optical resonator length $L=n(\lambda/2)$ with n less than or equal to 40.

3. The light source according to claim 1, wherein the optical medium is a mixture of several two-level systems with overlapping absorption or fluorescence bands.

4. The light source according to claim 1, wherein the light source is operated below the critical photon number in the resonator, at which the spectrum of the photons emitted from the light source is Boltzmann-distributed.

5. The light source according to claim 1, wherein the light source is operated above a critical photon number in the resonator, at which the spectrum of the photons emitted for the light source is Bose-Einstein-distributed.

6. The light source according to claim 1, wherein the optical medium is optically excited by pump light of a wavelength within the absorption or fluorescence bandwidth of the optical medium.

7. The light source according to claim 1, wherein it is optically pumped by an adjacent or enclosing or integrated additional light source that emits incoherent light within the absorption band/fluorescence band of the two-level system of the optical medium.

8. A method of generating light with an optical resonator and an optical medium excitable to light emission in it, the method comprising the steps of:
using a nonpopulation-inverted two-level system as optical medium with a metastable lower state;
setting an optical length of the curved mirror enclosing the resonator so that its free spectral bandwidth is greater than the absorption or fluorescence bandwidth of the optical media and only a single longitudinal mode and several transverse modes of the resonator are generated by excitation within the fluorescence bandwidth of the optical medium; and
operating the source with thermodynamic equilibrium of the radiation field with the medium and having a reabsorption probability of emitted photons greater than 50%.

9. The method according to claim 8, further comprising the step of:
introducing incoherent light into the optical medium within its absorption bandwidth by adjusting the photon number of the resonator above the critical photon number at which at least partially coherent spectrally Bose-Einstein-distributed light is emitted.

10. The method according to claim 8, further comprising the step of:
introducing light with a first bandwidth into the optical medium for emission with a second bandwidth smaller relative to the first, Boltzmann-distributed with maximum intensity in or near the single longitudinal mode as upper wavelength limit.

11. The method according to claim 8 wherein operation occurs without addition of energy to the medium or so that the medium is cooled by choice of the spectrum of a pump light source.

* * * * *